(12) United States Patent
Karp

(10) Patent No.: US 9,542,307 B2
(45) Date of Patent: Jan. 10, 2017

(54) SHIFTABLE MEMORY DEFRAGMENTATION

(75) Inventor: Alan H Karp, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 5 days.

(21) Appl. No.: 14/381,854

(22) PCT Filed: Mar. 2, 2012

(86) PCT No.: PCT/US2012/027607
§ 371 (c)(1),
(2), (4) Date: Aug. 28, 2014

(87) PCT Pub. No.: WO2013/130109
PCT Pub. Date: Sep. 6, 2013

(65) Prior Publication Data
US 2015/0046644 A1 Feb. 12, 2015

(51) Int. Cl.
*G06F 12/00* (2006.01)
*G06F 12/02* (2006.01)
(Continued)

(52) U.S. Cl.
CPC ......... *G06F 12/023* (2013.01); *G06F 3/0608* (2013.01); *G06F 17/30135* (2013.01); *G11C 7/1036* (2013.01); *G11C 13/0007* (2013.01); *G11C 19/00* (2013.01); *G11C 19/28* (2013.01); *G06F 2212/161* (2013.01); *G06F 2212/70* (2013.01)

(58) Field of Classification Search
CPC ............. G06F 12/023; G06F 17/30135; G06F 2212/161; G06F 2212/70; G06F 3/0608; G11C 7/1036; G11C 19/00; G11C 19/28; G11C 13/0007
See application file for complete search history.

(56) References Cited

U.S. PATENT DOCUMENTS

| 3,593,310 A | 7/1971 | Kievit |
| 3,670,313 A | 6/1972 | Beausoleil et al. |

(Continued)

FOREIGN PATENT DOCUMENTS

| CN | 1762027 A | 4/2006 |
| CN | 101162471 A | 4/2008 |

(Continued)

OTHER PUBLICATIONS

Compton, K. at at.. Configuration Relocation and Defragmentation for Reconfigurable Computing,, In Proc of FPGAs for Custom Computing Machines, Apr. 2001. 16 pages.

(Continued)

*Primary Examiner* — Shawn X Gu
(74) *Attorney, Agent, or Firm* — North Shore Associates

(57) ABSTRACT

Shiftable memory that supports defragmentation includes a memory having built-in shifting capability, and a memory defragmenter to shift a page of data representing a contiguous subset of data stored in the memory from a first location to a second location within the memory to be adjacent to another page of stored data. A method of memory defragmentation includes defining an array in memory cells of the shiftable memory and performing a memory defragmentation using the built-in shifting capability of the shiftable memory to shift a data page stored in the array.

18 Claims, 6 Drawing Sheets

(51) Int. Cl.
| | | |
|---|---|---|
| G11C 13/00 | (2006.01) | |
| G06F 17/30 | (2006.01) | |
| G06F 3/06 | (2006.01) | |
| G11C 19/28 | (2006.01) | |
| G11C 19/00 | (2006.01) | |
| G11C 7/10 | (2006.01) | |

(56) References Cited

U.S. PATENT DOCUMENTS

| | | |
|---|---|---|
| 3,708,690 A | 1/1973 | Paivinen |
| 3,760,382 A | 9/1973 | Itoh |
| 3,797,992 A | 3/1974 | Brown |
| 3,812,336 A | 5/1974 | Bossen et al. |
| 3,838,396 A | 9/1974 | Martin |
| 3,893,088 A | 7/1975 | Bell |
| 3,916,388 A | 10/1975 | Shimp |
| 4,037,205 A | 7/1977 | Edelberg et al. |
| 4,133,043 A | 1/1979 | Hiroshima et al. |
| 4,322,365 A | 3/1982 | Merger et al. |
| 4,322,635 A | 3/1982 | Redwine |
| 4,504,925 A | 3/1985 | Gilhousen |
| 4,521,874 A | 6/1985 | Rau et al. |
| 4,532,606 A | 7/1985 | Phelps |
| 4,845,670 A | 7/1989 | Nishimoto et al. |
| 4,864,544 A | 9/1989 | Spak et al. |
| 4,903,240 A | 2/1990 | Von Flue |
| 5,050,067 A | 9/1991 | McLagan |
| 5,153,846 A | 10/1992 | Rao |
| 5,299,156 A | 3/1994 | Jiang et al. |
| 5,313,433 A | 5/1994 | Waller |
| 5,504,919 A | 4/1996 | Lee et al. |
| 5,543,748 A | 8/1996 | Ando |
| 5,612,964 A | 3/1997 | Haraszti |
| 5,625,355 A | 4/1997 | Takeno |
| 5,677,864 A * | 10/1997 | Chung .......... G06F 9/3879 365/230.03 |
| 5,698,997 A | 12/1997 | Williamson et al. |
| 5,860,104 A | 1/1999 | Witt et al. |
| 5,930,323 A | 7/1999 | Tang et al. |
| 6,021,075 A | 2/2000 | Ueno |
| 6,061,417 A | 5/2000 | Kelem |
| 6,166,748 A | 12/2000 | Van Hook |
| 6,239,638 B1 | 5/2001 | Masuda |
| 6,327,175 B1 | 12/2001 | Manapat et al. |
| 6,362,660 B1 | 3/2002 | Deng |
| 6,411,230 B1 | 6/2002 | Tauchen |
| 6,493,794 B1 | 12/2002 | Yamashita |
| 6,526,505 B1 | 2/2003 | Epstein |
| 6,560,696 B1 | 5/2003 | Hummel |
| 6,678,806 B1 | 1/2004 | Redford |
| 6,725,347 B2 | 4/2004 | Yang |
| 6,745,216 B1 | 6/2004 | Nakamura |
| 6,765,832 B1 | 7/2004 | Ohtani |
| 6,820,186 B2 | 11/2004 | Webber et al. |
| 6,834,005 B1 | 12/2004 | Parkin |
| 7,027,338 B2 | 4/2006 | Lee |
| 7,051,153 B1 | 5/2006 | Lin et al. |
| 7,093,084 B1 | 8/2006 | LeBlanc |
| 7,228,391 B2 | 6/2007 | Silvera et al. |
| 7,293,132 B2 | 11/2007 | Hurley |
| 7,308,553 B2 | 12/2007 | Liang |
| 7,463,056 B1 | 12/2008 | Anderson |
| 7,502,896 B2 | 3/2009 | Isani et al. |
| 7,508,701 B1 | 3/2009 | Liang et al. |
| 7,570,611 B2 | 8/2009 | Stone |
| 7,573,310 B2 | 8/2009 | Yang et al. |
| 7,608,849 B2 | 10/2009 | Ino et al. |
| 7,653,895 B1 | 1/2010 | James-Roxby et al. |
| 7,728,327 B2 | 6/2010 | Kim et al. |
| 7,728,391 B2 | 6/2010 | Zhang |
| 7,791,376 B2 | 9/2010 | Lim et al. |
| 7,861,056 B2 | 12/2010 | Marathe et al. |
| 7,864,560 B2 | 1/2011 | Tran |
| 7,983,068 B2 | 7/2011 | Ufert |
| 8,510,503 B2 | 8/2013 | Yagihashi |
| 8,717,831 B2 | 5/2014 | Hadley |
| 8,972,630 B1 | 3/2015 | Stark |
| 2002/0089024 A1 | 7/2002 | Iwata |
| 2002/0138715 A1 | 9/2002 | Minematsu |
| 2002/0194401 A1 | 12/2002 | Sakugawa |
| 2003/0147488 A1 | 8/2003 | Nakamura |
| 2004/0019715 A1 | 1/2004 | Apfeldorfer et al. |
| 2004/0027863 A1 | 2/2004 | Lee et al. |
| 2004/0193775 A1 | 9/2004 | Van Doren et al. |
| 2004/0201010 A1 | 10/2004 | Ugajin |
| 2004/0205304 A1 | 10/2004 | McKenney et al. |
| 2004/0239606 A1 | 12/2004 | Ota |
| 2005/0127524 A1 | 6/2005 | Sakamoto et al. |
| 2005/0138501 A1 | 6/2005 | Motika et al. |
| 2005/0163277 A1 | 7/2005 | Georgakos |
| 2006/0274585 A1 | 12/2006 | Jung |
| 2007/0080345 A1 | 4/2007 | Joo et al. |
| 2007/0083571 A1 | 4/2007 | Meller et al. |
| 2007/0165446 A1 | 7/2007 | Oliva et al. |
| 2007/0211531 A1 | 9/2007 | Atti et al. |
| 2007/0262408 A1 | 11/2007 | Takagi et al. |
| 2007/0267627 A1 | 11/2007 | Joo et al. |
| 2007/0294469 A1 | 12/2007 | Teruyama |
| 2008/0071748 A1 | 3/2008 | Wroblewski et al. |
| 2008/0117700 A1 | 5/2008 | Nakamura |
| 2009/0010043 A1 | 1/2009 | Gonzalez et al. |
| 2009/0193384 A1 | 7/2009 | Sima et al. |
| 2009/0294869 A1 | 12/2009 | Chen |
| 2009/0323445 A1 | 12/2009 | Adams et al. |
| 2010/0023730 A1 | 1/2010 | Leeland |
| 2010/0141322 A1 | 6/2010 | Chua-Eoan |
| 2010/0164972 A1 | 7/2010 | Akerib |
| 2010/0193824 A1 | 8/2010 | Kim et al. |
| 2010/0332752 A1 * | 12/2010 | Donatiello ............ G06F 3/0608 711/115 |
| 2011/0022791 A1 | 1/2011 | Iyer et al. |
| 2011/0026314 A1 | 2/2011 | Hamouche et al. |
| 2011/0063893 A1 | 3/2011 | Behera et al. |
| 2011/0085390 A1 | 4/2011 | Arsovski et al. |
| 2011/0106742 A1 | 5/2011 | Pino |
| 2011/0252008 A1 | 10/2011 | Chamberlain et al. |
| 2012/0104346 A1 | 5/2012 | Yi et al. |
| 2012/0138885 A1 | 6/2012 | Wu et al. |
| 2013/0048950 A1 | 2/2013 | Levy et al. |
| 2013/0106480 A1 | 5/2013 | Ribeiro et al. |
| 2013/0282974 A1 | 10/2013 | Joisha |
| 2014/0126309 A1 | 5/2014 | Kelly |
| 2014/0297985 A1 | 10/2014 | Graefe |
| 2014/0304467 A1 | 10/2014 | Pickett |
| 2014/0310453 A1 | 10/2014 | Golab |
| 2014/0379977 A1 | 12/2014 | Perner |
| 2015/0006809 A1 | 1/2015 | Harizopoulos |
| 2015/0046644 A1 | 2/2015 | Karp |

FOREIGN PATENT DOCUMENTS

| | | |
|---|---|---|
| CN | 101336447 | 12/2008 |
| CN | 101594319 A | 12/2009 |
| CN | 101673804 | 3/2010 |
| EP | 0237337 A2 | 9/1987 |
| EP | 0827156 | 4/1998 |
| EP | 1617482 A2 | 1/2006 |
| GB | 2390179 | 12/2003 |
| JP | 63231798 | 9/1988 |
| JP | 2005071500 | 3/2005 |
| JP | 5066921 | 11/2012 |
| JP | 2008174037 | 11/2012 |
| KR | 102006000619 | 1/2006 |
| WO | WO-9314459 | 7/1993 |

OTHER PUBLICATIONS

Lee et al, "High-Speed Median Fitter Designs Using Shiftable Content-Addressable Memory," IEEE Trans. Circuits and Systems for Video Tech.V4, #6, Dec. 1994~644-549.

PCT Search Report/Written Opinion—Application No. PCT/US2012/027607 dated Nov. 28. 2012—9 pages.

(56) References Cited

OTHER PUBLICATIONS

Roberto Perez-Andrade et al., "A Versatile Linear Insertion Sorter Based on a FIFO Scheme," IEEE Computer Society Annual Symposium on VLSI, 2008. pp. 357-362.
Athanassoulis et al., MASM: Efficient Online Updates in Data Warehouses, ACM Special Interest Group on Management of Data Conference, Jun. 2011, 12 pages.
Bender et al., Insertion Sort is O (n log n). In Proceedings of the Third International Conference on FunWith Algorithms (FUN), 2004 (6 pages).
Boriskov, P.P. et al., Metal-insulator Transition in Electric Field: a Viewpoint from the Switching Effect, (Research Paper), Feb. 28, 2006, 18 Pages.
Chen, F. et al., S-shaped Negative Differential Resistance Modeling in Electro-thermal Simulation of Phase-change Memory Programming, (Research Paper), Non-Volatile Memory Technology Symposium, Nov. 10-13, 2007 (4 pages).
Chen-Yi Lee et al., "High-Speed Median Filter Designs Using Shiftable Content-Addressable Memory," IEEE Trans. Circuits and Systems for Video Tech., vol. 4, No. 6, Dec. 1994, pp. 544-549.
Chudnovskii, F.A. et al., Switching Phenomena in Chromium-doped Vanadium Sesquioxide, (Research Paper), Journal of Applied Physics, Sep. 1, 1998, vol. 84, No. 5, pp. 2643-2646.
Chudnovskiy, F. et al., "Switching Device Based on First-order Metalinsulator Transition Induced by External Electric Field," IEEE Future Trends in Microelectronics: the Nano Millennium, Wiley Interscience, 2002, pp. 148-155.
Graefe, G., "B-tree Indexes, Interpolation Search,and Skew," IEEE Proceedings of the Second International Workshop on Data Management on New Hardware (DaMoN 2006), Jun. 25, 2006, Chicago, IL (10 pages).
Han et al., Integer Sorting in ($n\sqrt{loglog\ n}$) Expected Time and Linear Space, 2002 (10 pages).
Hikita, Y. et al., Negative Differential Resistance Induced by Mn Substitution at $SrRuO_3/Nb:SrTiO_3$ Schottky Interfaces, (Research Paper), Journals of American Physical Society, Mar. 19, 2008, vol. 77, No. 20., 14 Pages.
IEEE P1003.1, Draft 6, Apr. 2001/Open Group Technical Standard, Issue 6, Draft Standard for Information Technology—Portable Operating System Interface (POSIX) (23 pages).
Mikkel Thorup, Chapter 1—On RAM priority queues, 1996 (9 pages).
Pickett et al., "Coexistence of Memristance and Negative Differential Resistance in a Nanoscale Metal-Oxide-Metal System," IEEE Advanced Materials, 2011 (4 pages).
Stephen C. Johnson, Algorithms for the 21st century presented at the 2006 USENIX Annual Technical Conference, Boston, MA, vol. 31, No. 5, 2006 (7 pages).
U.S. Appl. No. 14/126,732, Notice of Allowance dated Mar. 16, 2016 (15 pages).
Youn, D.H. et al., Observation of Abrupt Metallic Transitions in p-Type GaAs Devices and Comparison with Avalanche Breakdown in the InGaAs APD, (Research Paper), Journal of the Korean Physical Society, Jul. 1, 2005, vol. 47, No. 1 (5 pages).

* cited by examiner

| 00 | 01001000 |
| 01 | 01111000 |
| 02 | 11001000 |
| 03 | 01001110 |
| 04 | 11001010 |
| 05 | 01001010 |
| 06 | 11111011 |
| 07 | 00000001 |
| 08 | 11011011 |
| 09 | 01101111 |
| 10 | 11101011 |
| 11 | 01111010 |

| 00 | 01001000 |
| 01 | 01111000 |
| 02 | 11001000 |
| 03 | 01001110 |
| 04 | X |
| 05 | 11001010 |
| 06 | 01001010 |
| 07 | 11111011 |
| 08 | 00000001 |
| 09 | 11011011 |
| 10 | 11101011 |
| 11 | 01111010 |

*FIG. 1A*

| 00 | abc |
| 01 | def |
| 02 | ghi |
| 03 | jkl |
| 04 | mno |
| 05 | pqr |
| 06 | stu |
| 07 | vwx |
| 08 | yza |
| 09 | bcd |
| 10 | efg |
| 11 | hij |

| 00 | abc |
| 01 | def |
| 02 | jkl |
| 03 | mno |
| 04 | pqr |
| 05 | stu |
| 06 | X |
| 07 | vwx |
| 08 | yza |
| 09 | bcd |
| 10 | efg |
| 11 | hij |

*FIG. 1B*

SHIFTABLE MEMORY DEFRAGMENTATION

CROSS-REFERENCE TO RELATED APPLICATION

This application is a national stage application under 35 U.S.C. §371 of PCT/US2012/027607, filed Mar. 2, 2012.

STATEMENT REGARDING FEDERALLY SPONSORED RESEARCH OR DEVELOPMENT

N/A

BACKGROUND

Modern computers and related processing systems typically include a processor and some form of memory. The processor is generally responsible for performing the various computational tasks of the computer while the memory stores program code and data that is used in and generated by the computational tasks. The architectural division of processing by the processor and data storage by the memory has proven successful for nearly the entire history of such systems.

For example, a typical general-purpose computer usually includes a central processing unit (CPU) and a main memory that communicate with one another over one or more communication channels (e.g., data, command and address buses). Typically, the CPU provides facilities to perform various arithmetic and logical operations, to provide operational sequencing, and to otherwise control aspects of the general-purpose computer. For example, virtually all CPUs provide functions or operations for reading data from memory, writing data to memory and executing programs comprising a set of instructions that utilizes the data to perform a predefined task. In addition, CPUs may handle input/output (I/O) allowing communication with peripherals as well as subsystems outside of the general-purpose computer. CPUs may even provide graphics processing to handle generating and updating a graphical display unit (e.g., a monitor), in some examples.

In contrast, the main memory of modern computers, which can include one or more of static random access memory (SRAM), dynamic random access memory (DRAM), read-only memory (ROM), programmable ROM (PROM), flash memory and a variety of other memory types, typically provides a relatively narrow set of capabilities. Principal among these capabilities is storing computer programs and data that are executed and used by the CPU. Among other limited capabilities that may be found in or that are often associated with the main memory of modern computers are certain memory management functions. For example, DRAM memory subsystems of main memory may possess circuitry for automatic refresh of data stored therein.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which:

FIG. 1A illustrates an example of a downshift of a contiguous subset of data stored in a linear array within a shiftable memory, according to an example consistent with principles described herein.

FIG. 1B illustrates an example of an upshift of a contiguous subset of data stored in a linear array within a shiftable memory, according to an example consistent with principles described herein.

Figure 2:
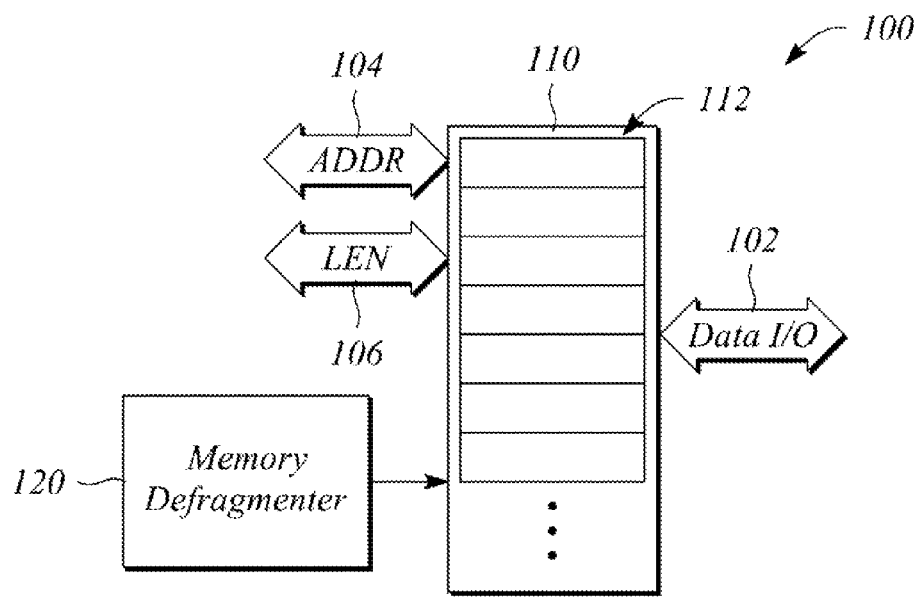
FIG. 2 illustrates a block diagram of a shiftable memory supporting memory defragmentation, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide memory defragmentation within and using memory having data shifting capability. In particular, the data shifting capability is substantially built into the memory, according to various examples. The built-in data shifting capability provides a physical translation or 'shift' of a contiguous subset of data stored in the memory. The shift, in turn, may be employed to affect memory defragmentation of the memory, according to various examples. Specifically, the shift of the contiguous subset of data acts to substantially compact the data stored in the memory.

Examples in accordance with the principles described herein have application to a variety of computing and data processing systems including, but not limited to, employing virtual memory in support of multitasking kernels. For example, various computing and related processing systems may employ virtual memory management to dynamically control the assignment of portions or blocks of memory (i.e., physical memory) for use by various active processes (e.g., applications) of the computing system.

According to various examples, a dynamic memory manager, such as a virtual memory management system, may be used to provide dynamic allocation of the memory blocks to the active processes during runtime. The dynamically allocated memory blocks may be used for temporary storage of data by the active processes, for example. As the active processes are assigned memory blocks and then subsequently release control of the memory blocks back to the dynamic memory manager, the memory may become fragmented. Memory defragmentation using and provided by the shiftable memory, according to examples of the principles described herein, may be employed to mitigate memory fragmentation that often results from such dynamic memory allocation, for example. Moreover, defragmentation with shiftable memory may be accomplished more efficiently in terms of computation system costs than by other methods, according to some examples.

In some examples, memory defragmentation using shiftable memory may be employed to compact substantially all of the memory of a computing system. In other examples, memory defragmentation may be limited to only a portion of the computing system memory. For example, memory defragmentation may be employed to compact only a selected portion of the memory to provide a contiguous block of free memory in the selected portion that is sufficient in size to support a memory allocation request of a particular process. In particular, the memory defragmentation provided by the shiftable memory may be employed to 'open' or increase a size of a block of free memory into which a new data (e.g., a data page or pages) may be inserted, for example. The free memory block having increased size may be rendered available for memory allocation by the memory manager after the memory defragmentation by the shiftable memory, for example.

Memory defragmentation described herein is based on shifting stored data using the built-in shifting capability of shiftable memory. According to various examples, moving or shifting data in the shiftable memory may be accomplished in less time and, in some examples in considerably less time, than is generally possible without using shiftable memory. Moreover, data shifting in shiftable memory often may be accomplished with considerably less computational overhead than in the absence of shiftable memory. In contrast, conventional memory that relies on a processor, for example, to perform a shift (e.g., in support of memory defragmentation) generally requires an amount of time that is proportional to an amount of data being shifted. In addition, shifting data in conventional memory necessarily employs the processor and a concomitant data movement and computational overhead associated therewith to shift the data.

For example, shifting data in conventional memory typically involves the processor reading the data to be shifted and then writing the data back to memory in another location. Reading and writing may be performed by the processor on a word-by-word basis due to the structure and functionality of conventional memory, for example. Since each data word in the data being shifted is first read from the conventional memory by the processor and then subsequently written back to the conventional memory, the time to shift the data is generally proportional to the amount or length of the data (e.g., number of data words in a data page) being shifted, for example. The larger the amount of data, the longer the shift operation will take. In addition, each read and write by the processor requires processor time (i.e., computational overhead).

Moreover, conventional memory relies on a resource (e.g., the processor) that is external to the conventional memory to perform the reading and writing when shifting the data. Since the resource performing the shift is external to the conventional memory, each of the data words involved in the word-by-word shift must pass between the external resource and the conventional memory through some form of data bus or similar communication channel. The data bus or similar communication channel may substantially limit a speed of the read and write operations and as a result, an overall speed of the shift. Hence, shifting large subsets of data can become prohibitively expensive in terms of the processing time due to one or both of the effects of data bus speed and the proportional time aspects of performing a shift using conventional memory.

In accordance with the principles described herein, shiftable memory has built-in shifting capability so that data is not read and then written by an external resource to perform a shift, for example. The contiguous subset of stored data is identified to the shiftable memory (e.g., using an address and a length) and the shiftable memory is instructed to shift the contiguous subset. The shift is then accomplished by and takes place entirely within the shiftable memory. Speed limitations associated with transferring data to and from an external resource are substantially eliminated by shiftable memory, according to examples of the principles described herein. Moreover, time for shifting may be substantially independent of the length of the contiguous subset, for example.

According to various examples, shifting within the shiftable memory may be implemented with circuitry of the shiftable memory itself. As such, shifting using shiftable memory does not require sequentially reading and writing each data word of the contiguous subset. For example, shifting using shiftable memory may shift all of the data in the contiguous subset in a substantially simultaneous manner. As such, the shiftable memory may implement shifting of the contiguous subset in a time that is substantially independent of the length of the contiguous subset.

In some examples, the shiftable memory may perform the shift in substantially constant time, according to the principles described. Moreover, the shiftable memory supporting memory defragmentation may accomplish the shift in a single step (e.g., clock cycle) of the system employing the shiftable memory. By 'constant time' it is meant that a substantially similar amount of time is required to shift the contiguous subset of data regardless of a length of the contiguous subset. For example, an arbitrary length contiguous subset may be shifted in a single clock cycle, according to some examples. In another example, a shorter contiguous subset may need only a single clock cycle while a longer contiguous subset may require two or more clock cycles. However, while the shiftable memory may use more time for longer subsets than relatively shorter subsets, the shift is still performed in substantially constant time since the time required is not strictly proportional to the contiguous subset length.

Herein, memory 'fragmentation' is defined as a phenomenon by which memory blocks containing stored data (i.e., 'used' memory blocks), or more precisely the data stored in the used memory blocks, is or has become scattered across the memory, as a whole. The scattering of the stored data typically results in the used memory blocks being interspersed with segments of unused or 'free' memory, according to some examples. Memory fragmentation may result in an inefficient usage or even a waste of the computing system memory, according to various examples. For example, due to memory fragmentation, contiguous blocks of free memory may become too small to accommodate requests for memory by a process or processes. When contiguous blocks of free memory become too small, these blocks are unusable by the computing system and thus may become 'wasted' memory, for example.

Herein, the term 'memory defragmentation' is defined as compacting or collecting data stored in two or more of the scattered used memory blocks to reduce memory fragmentation. In particular, the stored data may be collected together by moving or shifting the data stored in one or more of the used memory blocks from an original or first location to a second location in which the stored data occupies used memory blocks that are substantially adjacent to one another. For example, stored data of a first used memory block may be shifted to be located adjacent to stored data of a second used memory block. After the shift, there may be substantially no free memory between the stored data of the first and second memory blocks. According to various examples of the principles described herein, the built-in shifting capability of the shiftable memory is used to shift the data stored in the example first block to affect memory defragmentation.

In various examples of the principles described herein, the data stored in the used memory block is stored as a contiguous subset of data. Such a 'contiguous subset of data' is defined herein as representing a page of data, or equivalently as a data page. Equivalently, a 'page of data' or 'data page' may be defined as comprising a contiguous subset of data, for example. Further, a page of data may contain or provide storage for one or more bytes of data, by definition. For example, the page of data stored in memory (e.g., stored in the used memory block) may contain or be capable of containing one kilobyte (kB) of data. In another example, a page of data may contain, be capable of containing or be able to hold 4 kB of data. In yet another example, the data page may accommodate between one megabyte (MB) and a gigabyte (GB) of stored data.

In general, a particular size of a page of data (e.g., 1 kB vs. 1 MB, etc.) is established by the computing system that employs the data page (e.g., by the memory manager of the computing system). In some examples, the computing system may employ a single size for all data pages. In other examples, a plurality of data page sizes may be employed (e.g., 1 kB and 1 MB). In yet other examples, a size of a page of data may vary with each allocation by the memory manager. For example, page sizes may be dynamically determined based on an as needed basis by the memory manager. As used herein, a 'page of data' or equivalently a 'data page' is further defined as data stored in a collection or grouping of memory cells. In some examples, the page of data may represent a data file. For example, the data file may be stored in a file system in memory and the memory defragmentation may be used to reduce fragmentation of the file system.

As mentioned above, the shiftable memory shifts the page of data within the memory from a first memory location to a second memory location to accomplish memory defragmentation. When shifted to the second location, the data substantially retain an ordered relationship within the contiguous subset of data of the data page, according to some examples. Moreover, the shift takes place entirely within the memory and the shift is generally accomplished without using resources, such as a processor, that are outside of the memory. Further, the shift does not involve data being moved between a processor and the memory, according to various examples. As a result, the memory with built-in shifting capability is referred to as 'shiftable memory' herein.

Herein, by definition, the term 'memory' refers to any sort of memory that can receive and store data. The memory is generally consistent with memory that may be employed by a computer processor or in a computing system (e.g., computer memory), for example. In particular, by definition herein, memory refers to any sort of memory that can be written to and read from during operation of the computing system that employs the memory. For example, the memory may comprise random access memory (RAM). The random access memory may be static RAM (SRAM), for example. Other types of memory include, but are not limited to, dynamic random access memory (DRAM), flash and similar non-volatile memories that are writable during operation of the computing system, various forms of optical memory (e.g., re-writable optical discs), magnetic memory (e.g., computer hard drives) and various memory structures based on latches, flip-flops and other bi-stable constructs.

Also herein by definition, a 'memory' may comprise a plurality of groups of memory cells. A plurality of memory cells may be also be arranged as an array, according to some examples. For example, the memory cells may be arranged as a linear array. In another example, the memory cells are arranged in a two dimensional (2-D) array. Higher order (e.g., three or more dimensions) arrays also may be employed. In some examples, a lower order array (e.g., a linear array) is defined on an array with a larger dimension (e.g., 2-D array). For example, a linear array may be defined by an addressing arrangement on a rectangular 2-D array of memory cells. In addition, arrays may be divided into sub-arrays. For example, a 2-D array may be divided into quadrants as four sub-arrays. In another example, a 2-D array may be divided into rows and columns. A data page may comprise a row, for example.

According to various examples, the array may be either a physical array or a logical (e.g., virtual) array. A physical array comprises memory cells that are physically organized or located relative to one another according to or as defined by the array. A logical array comprises a logical arrangement of the memory cells as an array. In a logical array, a physical arrangement of the memory cells may differ from the logical arrangement defined by the array, for example. Logical arrays may be defined using address indirection, for example.

A 'memory cell' is a circuit or related construct that holds or stores data, as defined and employed herein. Further, by definition herein, memory cells may store one or more 'bits' of data. For example, the bit may be a binary value (e.g., '0' or '1') and the memory cell may hold a single bit. In another example, the memory cell may hold a plurality of binary value bits. In particular, as defined herein, the memory cell may hold or store a complete data word comprising the plurality of bits. For example, a memory cell may hold 4, 8, 16, 32, 64, or more, binary bits. In yet another example, the memory cell may hold data in another form (e.g., a hexadecimal value, an analog value. etc.). In particular, memory cells, as defined herein, are not restricted to storing data in a binary format but in some examples, may hold or store an arbitrary data construct. However, for discussion purposes herein, binary data is generally employed throughout by way of example and not by way of limitation, unless otherwise stipulated. Further herein, a 'data word' is made up of one or more bytes of data. For example, a 32-bit data word may comprise four (4) 8-bit bytes of data. As such, a page of data may include hold 1 kB of data or 250 32-bit data words.

Memory cells are also often referred to as 'memory locations' herein. Strictly speaking, a memory location is a memory cell(s) at a particular location within the memory, the location being designated or identified by an address. The memory cell is accessed using the address, for example. However, for simplicity of discussion herein, memory cells are generally referred to as having or being at an address. Addresses or locations may be associated with a shiftable unit (e.g., a data word) of the memory, for example. As such, 'location' and 'address' may be employed interchangeably herein. In addition, 'location' may be used to refer to a location of a contiguous set of data that is designated by a starting address and an ending address, according to some examples. In other examples, the location of the contiguous set may be designated by a starting (or an ending) address and a length of the contiguous set.

As provided above, adjacent memory cells as defined by adjacent memory locations may be physically adjacent (i.e., located next to one another) or logically adjacent, by definition herein. Logical adjacency may be established by an overlying logical memory structure (e.g., using indirection), according to some examples. For example, logically adjacent memory cells may be physically separated from one another but still be considered adjacent in terms of an overlying memory structure that employs interleaving. Likewise, the contiguous subset may be physically contiguous (i.e., located in physically adjacent memory cells) or logically contiguous. In particular, the contiguous subset of data as stored in the adjacent memory cells of the shiftable memory acquires a contiguity that is analogous to and dictated by the adjacency of the memory cells, by definition herein.

Further herein and as noted above, a 'shift', as performed by shiftable memory, is defined as a physical translation of a contiguous subset of data (e.g., a page of data) stored within the memory, unless otherwise stipulated. In particular, by definition herein, a shift using shiftable memory constitutes the physical translation (e.g., left, right, up or down in an array) of the stored data within the contiguous subset from a first location to a second location within the memory. Furthermore, the shift, when applied to the contiguous subset of stored data, translates all of the stored data within the contiguous subset. Moreover, the shift by shiftable memory does not result in a translation or shift of data outside of the contiguous subset of data involved in the shift, by definition herein. In general, the shift may move the data by a distance of one or more memory locations or memory addresses. For example, the shift may move the data a single memory location up or down within the memory. In another example, the shift may move the data by a distance equivalent to a size of one or more data pages. In general, a distance of the shift is determined by a particular implementation of the shiftable memory, according to various examples.

Herein, shift directions 'left' and 'up' are defined with respect to memory locations within the shiftable memory as a shift direction toward locations having smaller addresses. The shift directions 'right' and 'down' are defined as a direction toward locations having larger addresses. Hence, an 'upshift' or a 'left shift' is defined as shifting the data to a second location having a smaller address than an address of a first or starting location. Conversely, a 'downshift' or a 'right shift' results in moving the data from a first location having a smaller address to a second location with a larger address. However, while the shift direction is controllable or selectable according to some examples, the shift direction (e.g., left, right, up or down) may be completely arbitrary with respect to the physical address space, as employed herein. Further, the specific use of 'left shift', 'right shift', 'upshift' and 'downshift' herein is for discussion purposes and not by way of limitation.

FIG. 1A illustrates an example of a downshift of a contiguous subset of data stored in a linear array within a shiftable memory, according to an example consistent with the principles described herein. In particular, FIG. 1A illustrates a plurality of memory cells, each of which is capable of storing a data word. For example, the data words may comprise eight binary bits, each bit (e.g., either a '1' or '0') being stored in a separate one of eight memory cells. Further as illustrated, each of the illustrated memory cells is identified by an address ranging from 00 to 11. A left side of FIG. 1A illustrates the plurality of memory cells before the downshift while a right side illustrates the same plurality of memory cells after the downshift. Note that the downshift illustrated in FIG. 1A may be viewed equivalently as a right shift by rotating the illustrated linear array by ninety degrees counterclockwise.

As illustrated, the example downshift within the shiftable memory comprises selecting a contiguous subset of stored data words starting with a memory cell at address 04 and ending with a memory cell at address 08, for example. The selected contiguous subset contains data words {11001010, 01001010, 11111011, 0000001, 11011011} in the illustrated example. The shiftable memory then downshifts the selected contiguous subset of data words by moving the stored data words down one address location, as illustrated in the right side of FIG. 1A. The downshift maintains an order of the data words within the contiguous subset and deposits the contiguous subset in memory cells between address 05 and address 09. Downshifting the stored data overwrites the contents of a memory cell immediately below the contiguous subset (i.e., at address 09) and replaces the contents of that memory cell with a last data word (i.e., '11011011') of the downshifted contiguous subset. Further, the memory cell at address 04 which originally held the first data value of the contiguous subset is rendered indeterminate as indicated by the 'X'. According to various examples, the memory cell at address 04 may retain a copy of the data word (e.g., '11001010') that was present before the downshift or may be cleared (e.g., set to '00000000') after the downshift.

In some examples, the memory cell at address 04 may be available for insertion of a data word from an external source, for example. A data word may be inserted into the memory cell at address 04 by sequentially presenting and clocking individual bits of the inserted data word into the memory cells of the memory cell at address 04 (e.g., a serial write), according to some examples.

FIG. 1B illustrates an example of an upshift of a contiguous subset of data stored in a linear array within a shiftable memory, according to an example consistent with the principles described herein. In particular, FIG. 1B illustrates a plurality of memory cells each of which stores a data word (e.g., 'abc,' 'def,' etc.). Further as illustrated, each of the illustrated memory cells is identified by an address ranging from 00 to 11. A left side of FIG. 1B illustrates the plurality of memory cells before the upshift while a right side illustrates the same plurality of memory cells after the upshift. Note that the upshift illustrated in FIG. 1B may be viewed equivalently as a left shift by rotating the illustrated linear array by ninety degrees counterclockwise.

As illustrated in FIG. 1B, the upshift in shiftable memory comprises selecting a contiguous subset of stored data words starting with a memory cell at address 03 and ending with a memory cell at address 06, for example. The shiftable memory then upshifts the selected contiguous subset by moving the stored data words in the selected contiguous subset up one address location, as illustrated in the right side of FIG. 1B. The upshift maintains an order of the words within the contiguous subset and deposits the contiguous subset in memory cells between address 02 and address 05. Upshifting the stored data words overwrites the contents of a memory cell immediately above the contiguous subset (i.e., at address 02) replacing the contents of that memory cell with a first word (i.e., 'jkl') of the upshifted contiguous subset. Further, the memory cell at address 06 which originally held the last word of the contiguous subset is rendered indeterminate as indicated by the 'X'. According to some examples, the memory cell at address 06 may retain a copy of the data word (e.g., 'stu') that was present before the upshift or may be cleared (e.g., set to '000') after the upshift. In some examples, the memory cell at address 06 may be available for insertion of data from an external source, for example.

According to some examples, the shiftable memory may be a portion of a main memory of a general-purpose computing system. The shiftable memory may represent a subset of the memory that makes up the main memory, for example. According to some examples, the shiftable memory may be a specialized partition of the main memory or a subsystem thereof. According to some examples, the shiftable memory may be physical memory that is accessed by or through virtual addressing via a memory management system, for example.

Further, as used herein, the article 'a' is intended to have its ordinary meaning in the patent arts, namely 'one or more'. For example, 'a data page' means one or more data pages and as such, 'the data page' means 'the data page(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Moreover, examples herein are intended to be illustrative only and are presented for discussion purposes and not by way of limitation.

FIG. 2 illustrates a block diagram of a shiftable memory 100 supporting memory defragmentation, according to an example consistent with the principles described herein. The shiftable memory 100 provides shifting of a contiguous subset of data (e.g., a data page) in the shiftable memory 100. Shifting of data by the shiftable memory 100 shifts only the data in the contiguous subset and not other data outside of the contiguous subset. In particular, when the shiftable memory 100 performs a shift of the contiguous subset, only data of the contiguous subset is shifted, according to various examples. The shift does not shift other data located outside of the contiguous subset, for example. Further, the shift moves the contiguous subset of data without substantially changing or otherwise affecting an order of the data in the contiguous subset, according to some examples. Additionally, the shiftable memory 100 supports memory defragmentation of data stored in the shiftable memory 100. The memory defragmentation may operate on data stored as a page or pages of data in the shiftable memory 100, according to some examples. The page or pages of data represent the contiguous subset of data shifted by the shiftable memory 100, according to various examples.

In some examples, an external resource (e.g., a processor) communicates data to and from the shiftable memory 100 via a data bus (Data I/O) 102. For example, data to be stored in the shiftable memory 100 may be communicated from the external resource to the shiftable memory 100 via the data bus 102. Similarly, data that is stored in and subsequently read from the shiftable memory 100 may be communicated to the external resource from the shiftable memory 100 via the data bus 102, for example. Information used to control an operation of the shiftable memory 100 such as, but not limited to, an address and a length of the contiguous subset, may be communicated to the shiftable memory 100 using an address bus (ADDR) 104 and a length bus (LEN) 106, according to some examples. A single address bus that carries both the address and the length or alternatively, a pair of addresses, may be employed in other examples (not illustrated).

As illustrated, the shiftable memory 100 that supports memory defragmentation comprises a memory 110 to store data. The memory 110 has built-in shifting capability to shift a page of data representing a contiguous subset of the stored data from a first location to a second location within the memory 110. In particular, the built-in shifting capability is configured to shift the page of data substantially within the memory 110. During the shift, the data is not transferred out of the memory 110 to accomplish the shift, according to various examples. For example, the second location may represent a shift distance relative to the first location of a unit of data. In various examples, the unit of data may comprise a data word, a page of data or a plurality of pages of data.

According to some examples, the shift may be accomplished by moving data along pathways within the memory 110 from the first location to an adjacent location of the memory 110 representing the second location, for example. Moving data to the adjacent location is referred to as an 'adjacent-location transfer,' herein. In another example, the shift may move the contiguous subset of data by more than one data unit (e.g., two or more pages). A shift of two or more data units may be accomplished by a direct shift using internal data pathways of the memory 110 from the first location to the second location that is two or more data units distant from the first location, for example. In other examples, the memory 110 having built-in shifting capability may move the data in a series of smaller steps (e.g., a plurality of adjacent-location transfers) to achieve the shift of more than one data unit. However, in each example, a built-in shifting capability of the memory 110 accomplishes the shift substantially without relying on or employing a transfer of the data in and out of the memory 110, according to various examples of the principles described herein.

According to some examples, the memory 110 comprises a plurality of memory cells 112 configured as an aggregate to store data. In some examples, the stored data may correspond to a data word. In some examples, the memory cells 112 are configured to store binary data. In some examples, each memory cell 112 is configured to store a single bit of binary data (e.g., as a '1' or '0'). In other examples, each memory cell 112 is configured to store a plurality of binary data bits. For example, each memory cell 112 may store a data word. In particular, according to some examples. each memory cell 112 comprises a plurality of memory locations configured as an aggregate to store data bits corresponding to the data word. The plurality of data bits of the data word defines a width of the memory cell 112. In other examples, the memory cell 112 may store the data in a form other than as one or more binary bits.

According to various examples, the memory 110 may be implemented using substantially any memory technology. For example, memory cells of the memory 110 may be implemented using static random access memory (SRAM) memory cells 112. In another example, one or more flip-flops such as, but not limited to, a D flip-flop, may be employed to implement the memory cells 112 of the memory 110. In other examples, yet another memory technology (e.g., DRAM, memristors, flash memory, etc.) may be used to implement the memory cells 12 of the memory 110.

According to some examples, the memory 110 further comprises a memory defragmenter 120. The memory defragmenter 120 is configured to shift the page of data using the built-in shifting capability of the memory 110. In particular, the memory defragmenter 120 is configured to shift the page of data by controlling an operation of the memory 110. The controlled operation, in turn, employs the built-in shifting capability of the memory 110 to shift the data of the page(s) of data. According to various examples, the second location to which the page of data is shifted is adjacent to another page of stored data in the memory 110.

In some examples, the shift provided by the memory defragmenter 120 comprises a page-sized shift. For example, the memory 110 may be configured to move the data in a page-sized shift as a single shift by the built-in shifting capability. In some examples, internal connections between adjacent memory cells 112 of the memory 110 may result in a shift offset that equals a page-sized distance. For example, a page in the memory 110 may correspond to a row and the shift may comprise moving the data from a first row to an adjacent row to accomplish the page-sized shift. In another example, the page-sized shift may be accomplished by a sequence of smaller shifts (e.g., word-sized shifts). Adjacent groups of memory cells 112 representing a data word may be interconnected to affect the word-size shift and multiple word-sized shifts may be employed to provide a page-sized shift, for example. In yet another example, the shift provided by the memory defragmenter 120 may move the stored data by a distance(s) that is not necessarily related to a page size. In these examples, shifting the page of data may be accomplished by an appropriate number of shifts to shift the page of data from the first location to the page-adjacent second location, regardless of the shift distance that the number of shifts may entail, for example.

In some examples, the shift provided by the memory defragmenter 120 comprises a shift of each of a plurality of pages of data. In some examples, each of the plurality of pages of data is shifted until all of the pages of the plurality are adjacent to one another. As such, the shift of each of the pages of data substantially compacts the data pages into a localized region or portion of the memory 110, for example. The localized region may be at an end of the memory 110, in some examples. For example, the shift of each of the pages of data in the plurality may move all of the pages to a vicinity of a beginning end (e.g., an end having a smallest address) or to a vicinity of a terminal end (e.g., an end having a largest address) of the memory 110. In another example, the shift may move all of the pages of data to a second location adjacent to a page of data that is not moved by the shift.

In some examples, the shift of each of the plurality of pages implements a sequential compaction of the shifted pages. As defined herein, a 'sequential compaction' comprises sequentially shifting individual ones of the plurality of pages to compact all of the data pages in the plurality. For example, sequential compaction may shift all of the data pages in the plurality to be adjacent to one another beginning with a first page of data that is closest to an end of the memory 110. The sequential compaction may then continue by shifting a second page of data, followed by a third, and so on until all of the data pages in the plurality are shifted to be adjacent to one another. In another example of sequential compaction, a last page may be shifted to be adjacent to an adjacent, next-to-last page of data. For example, a fourth page may be shifted to be adjacent to the third page. Then the combined last data page and next-to-last data page may be shifted as a group to be adjacent to another page of data until all of the pages are adjacent to one another. As such, the combined third and fourth pages may be shifted as a group to be adjacent to a second page, and so on, until the sequential compaction is completed, for example.

Figure 3A:
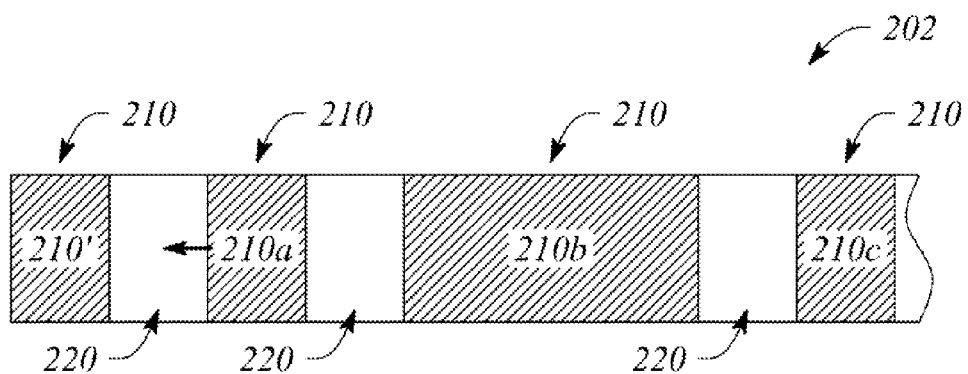
FIG. 3A illustrates a memory map of a plurality of data pages stored in a portion of a memory, according to an example consistent with the principles described herein.

FIG. 3A illustrates a memory map of a plurality of data pages 210 stored in a portion of a memory 202, according to an example consistent with the principles described herein. In particular, FIG. 3A illustrates the memory 202 as a fragmented memory having the plurality of data pages 210 distributed across an illustrated portion thereof. Further illustrated is free memory 220 distributed between the data pages 210 within the illustrated portion. The memory 202 may comprise shiftable memory substantially similar to the shiftable memory 100 described above, for example. The shiftable memory of the memory 202 may be specifically configured to shift data pages 210 of different sizes (e.g., two sizes are illustrated), according to some examples.

Figure 3B:
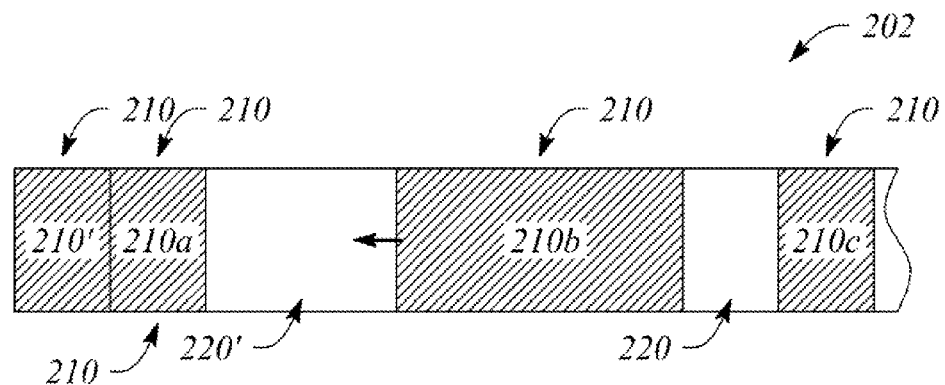
FIG. 3B illustrates the memory map illustrated in FIG. 3A following memory defragmentation, according to an example consistent with the principles described herein.

FIG. 3B illustrates the memory map illustrated in FIG. 3A following memory defragmentation, according to an example consistent with the principles described herein. In particular, FIG. 3B illustrates the memory 202 after a first data page 210a closest to a left end of the memory 202, for example, has been shifted using the built-in shifting capability of the shiftable memory of the memory 202. The shift of the first data page 210a is depicted using a heavy arrow in FIG. 3A, for example. As illustrated, after the shift, the first data page 210a has been moved from a first location (in FIG. 3A) to a second location (in FIG. 3B) adjacent to another data page 210' in a vicinity of the left end of the memory 202. Note that the other data page 210' is not shifted by the shiftable memory of the memory 202 in the illustrated example. Further, a larger region of free memory 220' is created between the first data page 210a and a second data page 210b after the shift, as illustrated. The compaction of stored data provided by the shift of the first data page 210a using the shiftable memory reduces the fragmentation of the memory 202 resulting a defragmentation (albeit a partial defragmentation) thereof, as illustrated in FIG. 3B.

Figure 3C:
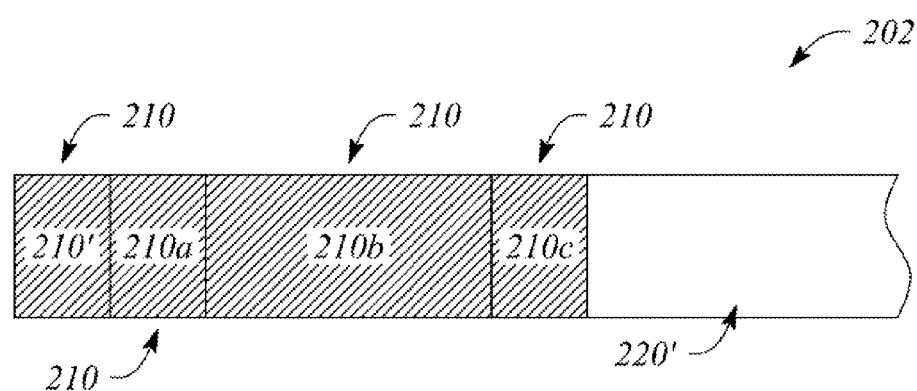
FIG. 3C illustrates the memory map illustrated in FIG. 3B in another configuration following further memory defragmentation, according to an example consistent with the principles described herein.

FIG. 3C illustrates the memory map illustrated in FIG. 3B in another configuration following further memory defragmentation, according to an example consistent with the principles described herein. The configuration illustrated in FIG. 3C may be an end result of a sequential compaction, for example. For example, a horizontal heavy arrow in FIG. 3B illustrates a next shift of data pages 210 that continues a sequential compaction started in FIGS. 3A and 3B.

In particular, as illustrated in FIG. 3C, the second data page 210b has been shifted to be adjacent to the first data page 210a. Likewise, a third data page 210c has been shifted adjacent to the shifted second data page 210b. Note that the second data page 210b has a different page size than that of other data pages 210, as illustrated. While not explicitly shown, each of the shifted data pages 210a, 210b. 210c was shifted in succession using sequential shifting (i.e., the first data page 210a followed by the second data page 210b and so on) until all of the data pages 210a, 210b, and 210c were co-adjacent, as illustrated in FIG. 3C. Moreover, the larger contiguous free memory 220' created by the sequential compaction is substantially maximized by the memory defragmentation result illustrated in FIG. 3C.

Figure 4A:
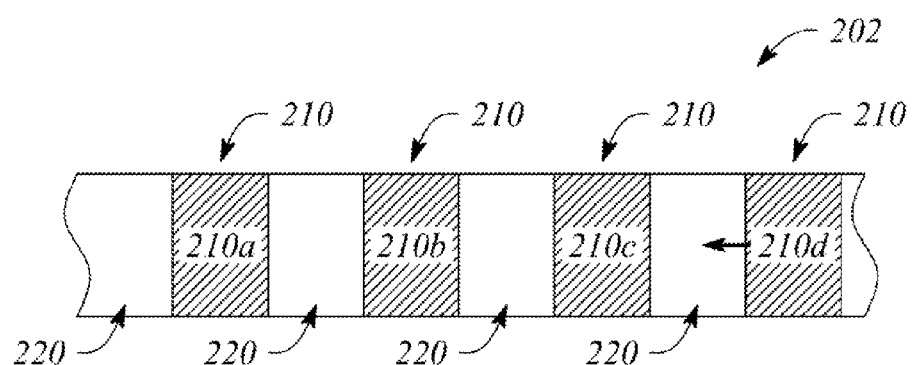
FIG. 4A illustrates a memory map of a plurality of data pages stored in a portion of a memory, according to an example consistent with the principles described herein.

FIGS. 4A-4D illustrate another example of memory defragmentation using shiftable memory, according to an example consistent with the principles described herein. In particular, FIG. 4A illustrates a memory map of a plurality of data pages 210 stored in a portion of a memory 202, according to an example consistent with the principles described herein. The memory map of data pages 210 illustrated in FIG. 4A may be substantially similar to the memory map illustrated in FIG. 3A, in some examples. Specifically, FIG. 4A illustrates the memory 202 as a fragmented memory having the plurality of data pages 210 distributed across an illustrated portion of the memory 202, as was illustrated in FIG. 3A.

Figure 4B:
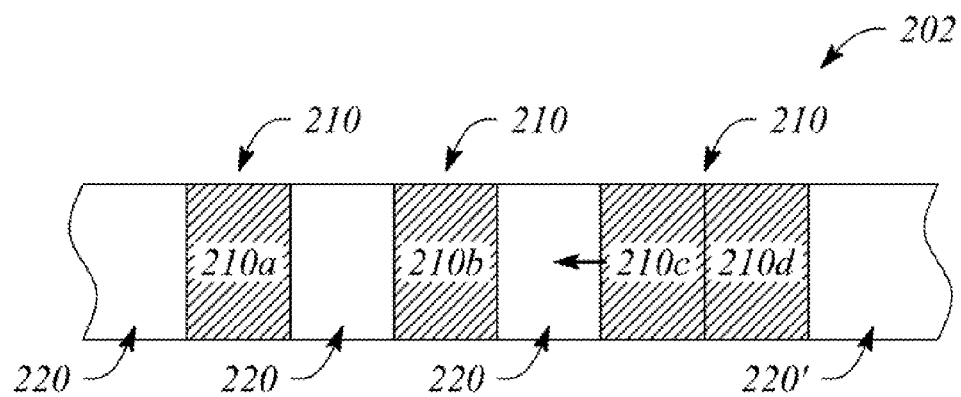
FIG. 4B illustrates the memory map illustrated in FIG. 4A following memory defragmentation, according to an example consistent with the principles described herein.

FIG. 4B illustrates the memory map illustrated in FIG. 4A following memory defragmentation, according to an example consistent with the principles described herein. In particular, FIG. 4B illustrates the memory 202 after a fourth data page 210d farthest from a beginning end (e.g., a left end) of the memory 202 has been shifted using the built-in shifting capability of the shiftable memory of the memory 202. As illustrated, the fourth data page 210d has been moved from a first location to a second location adjacent to the third data page 210c. As with the previous example, shifting the data pages 210 creates larger contiguous free memory 220'.

Figure 4C:
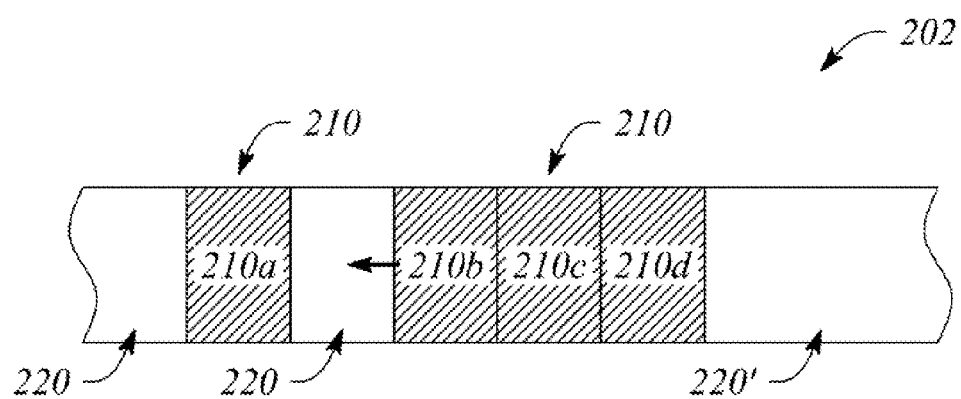
FIG. 4C illustrates the memory map illustrated in FIG. 4B in another configuration following further memory defragmentation, according to an example consistent with the principles described herein.
Figure 4D:
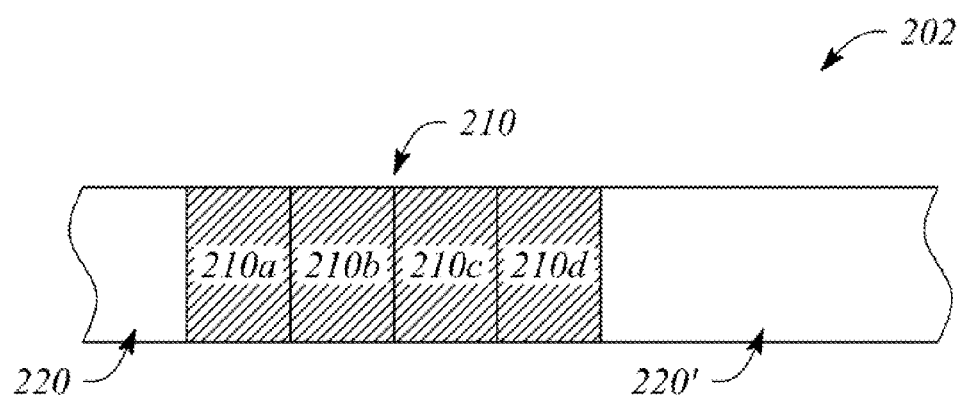
FIG. 4D illustrates the memory map illustrated in FIG. 4C in yet another configuration following still further memory defragmentation, according to an example consistent with the principles described herein.

FIG. 4C illustrates the memory map illustrated in FIG. 4B in another configuration following further memory defragmentation, according to an example consistent with the principles described herein. In particular, as illustrated in FIG. 4C, a combination of the third and fourth data page 210c, 210d has been shifted to be adjacent to the second data page 210b. FIG. 4D illustrates the memory map illustrated in FIG. 4C in yet another configuration following still further memory defragmentation, according to an example consistent with the principles described herein. In particular, as illustrated in FIG. 4D, a combination of the second, third and fourth data page 210b, 210c, 210d has been shifted to be adjacent to the first data page 210a. As such, FIG. 4D may illustrate an end result of a sequential compaction of the data pages 210 to defragment the memory 202, according to some examples. Also, note that with each successive shift in the illustrated sequential compaction of FIGS. 4A-4D, an overall size of the contiguous subset of data being shifted generally increased (e.g., from one data page 210 to a plurality of data pages 210) until all of the data pages 210 are co-adjacent, as illustrated. Further, shifts in FIGS. 4A-4D are illustrated by heavy arrows. The shifts illustrated by heavy arrows may be page-sized shifts, for example. Moreover, the contiguous free memory 220' became progressively larger.

Figures 5, 6:
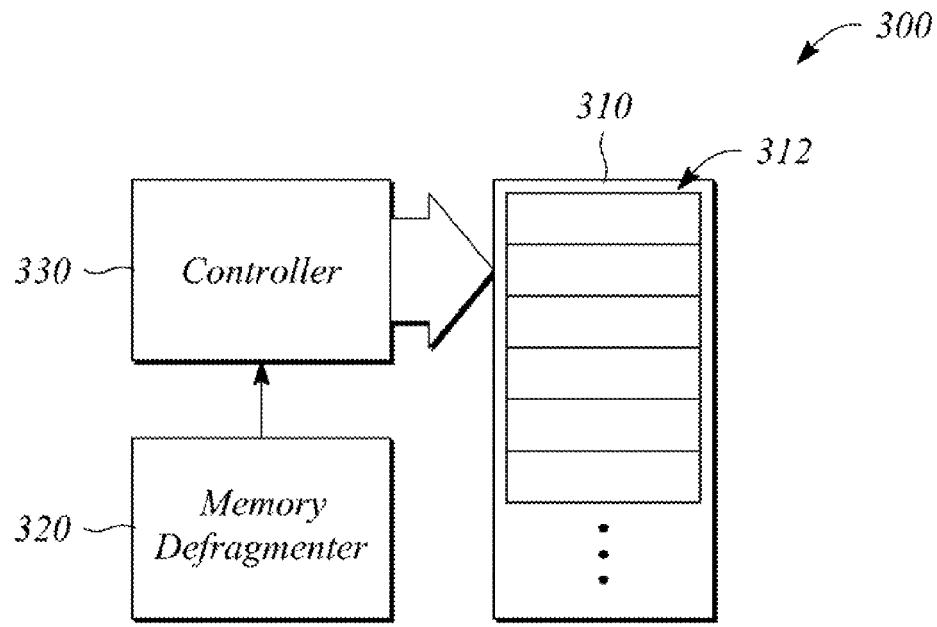
FIG. 5 illustrates a block diagram of a memory defragmentation system, according to an example consistent with the principles described herein.
FIG. 6 illustrates a portion of a truth table of an augmented decoder, according to an example consistent with the principles described herein.

FIG. 5 illustrates a block diagram of a memory defragmentation system 300, according to an example consistent with the principles described herein. As illustrated, the memory defragmentation system 300 comprises a shiftable memory 310. The shiftable memory 310 comprises a plurality of memory cells 312. The shiftable memory 310 has built-in data shifting capability to shift a contiguous subset of data stored in the memory cells 312 within the shiftable memory 310. According to various examples, the contiguous subset of data represents a page of data and has a size that is smaller than a total size of the shiftable memory 310.

In some examples, the shiftable memory 310 is substantially similar to the memory 110 described above with respect to the shiftable memory 100.

As illustrated in FIG. 5, the memory defragmentation system 300 further comprises a memory defragmenter 320. In some examples, the memory defragmenter 320 is substantially similar to the memory defragmenter 120 described above with respect to the shiftable memory 100. In particular, according to some examples, the memory defragmenter 320 is configured to perform a shift of the page of data from a first location in the shiftable memory 310 to a second location. The second location may be adjacent to another page of data stored in the shiftable memory, for example. The shift is performed using the built-in shifting capability of the shiftable memory 310, according to various examples.

Further as illustrated in FIG. 5, the memory defragmentation system 300 further comprises a controller 330. The controller 330 is configured to select the contiguous subset of the data representing the page of data. The controller 330 is further configured to implement the shift using the built-in shifting capability under direction of the memory defragmenter 320. In particular, the memory defragmenter 320 may control or otherwise interact with the controller 330 to affect memory defragmentation, according to some examples. In some examples, the controller 330 comprises the memory defragmenter 320. In other examples, the memory defragmenter 320 is implemented other than in, or as part of, the controller 330 (e.g., as part of a memory management system).

In some examples, the controller 330 comprises an augmented decoder (not illustrated). The augmented decoder employs information regarding an address and a length (or alternatively the first and last memory cell addresses) to select the page of data. In some examples, the augmented decoder uses the information (e.g., address and length of the data page) to assert an output corresponding to each of a plurality of memory cells 312 that store the data of the data page within the shiftable memory 310. Asserting an output may comprise outputting a logic '1' on a connection path or wire (e.g., a word line W) between the augmented decoder and the plurality of memory cells 312, for example. As such, the augmented decoder may output a logic '1' on a plurality of word lines of the memory 310, the word lines corresponding to the memory cells 312 that contain the stored data of the selected data page. The word lines may be connected to a load enable input or a select input of the memory cells 312, for example. In other examples, asserting an output comprises outputting a logic '0.' Asserting a logic '0' may be used when the memory cells 312 have a 'not' load enable input or a 'not' select input, for example.

In some examples, the augmented decoder is further configured to assert an additional output corresponding to either a memory cell 312 adjacent to and immediately above the selected contiguous subset or a memory cell 312 adjacent to and immediately below the selected contiguous subset. For example, the additional output corresponding to the memory cell 312 immediately above (or to the left of) the selected data page may be asserted when the stored data is to be upshifted (or left shifted) within the shiftable memory 310. The additional output corresponding to the memory cell 312 immediately below (or to the right of) the selected data page may be asserted when the stored data is to be downshifted (or right shifted) within the shiftable memory 310. for example. In particular, the additional output may be used to enable the memory cell 312 that receives stored data from either the first memory cell 312 or the last memory cell 312 of the page of data, for example.

FIG. 6 illustrates a portion of a truth table of an augmented decoder, according to an example consistent with the principles described herein. In particular, the augmented decoder corresponding to the illustrated truth table is configured to select the contiguous subset in an example shiftable memory 310 having eight memory cells 312. The truth table has three address inputs (ADDR), a length (LEN) input and eight word lines W (i.e., $W_0$-$W_7$). The eight word lines W may correspond to load enable inputs of eight memory cells 312 in the example shiftable memory 310, for example. As can be seen in the truth table, for a value of LAN equal to '00', the augmented decoder functions substantially similar to a conventional decoder (i.e., only one word line W is asserted at a time). However, a plurality of word lines W is asserted for all other values of LEN to facilitate simultaneous enabling of a corresponding plurality of memory cells 312 that hold or store the selected contiguous subset of stored data to be shifted.

In some examples, the augmented decoder may be implemented using a read only memory (ROM). The ROM is programmed with a truth table that specifies the functionality of the augmented decoder. A decoder of the ROM decodes an input (e.g., ADDR and LEN) and the programmed connections within the ROM augment the output of the ROM decoder to produce the augmented decoder functionality, for example. In another example, a conventional decoder may be augmented with an output circuit other than the programmed connections to implement the augmented decoder. In yet another example, the augmented decoder may be implemented using a latched ripple cascade.

Figure 7:
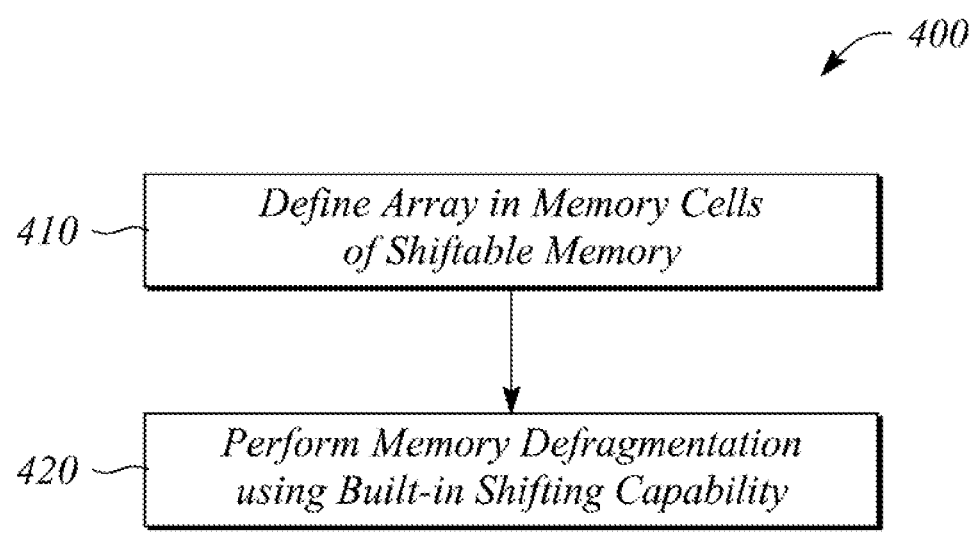
FIG. 7 illustrates a flow chart of a method of memory defragmentation using shiftable memory, according to an example consistent with the principles described herein.

FIG. 7 illustrates a flow chart of a method 400 of memory defragmentation using shiftable memory, according to an example consistent with the principles described herein. As illustrated, the method 400 of memory defragmentation using shiftable memory comprises defining 410 an array in memory cells of the shiftable memory. The shiftable memory has a plurality of memory cells with a built-in shifting capability to shift a contiguous subset of data stored in the array from a first location to a second location. In some examples, the shiftable memory is substantially similar to the memory 110 having built-in shifting capability described above with respect to the shiftable memory 100. In particular, a size of the contiguous subset of data of the shiftable memory is less than a total size of the shiftable memory and the built-in shifting capability comprises one or both of an upshift and a downshift, according to various examples.

The method 400 of memory defragmentation using shiftable memory further comprises performing 420 memory defragmentation by using the built-in shifting capability to shift a data page representing the contiguous subset of data stored in the array. The shift is from the first location in the shiftable memory to a second location. In some examples, the second location is adjacent to another page of data stored in the shiftable memory. When the data page in the array is shifted, the shifting occurs entirely within the shiftable memory and only data of the contiguous subset is shifted, according to various examples. In some examples, memory defragmentation may be performed 420 using a memory defragmenter 120 in conjunction with the memory of the shiftable memory 100.

In some examples, the shiftable memory provides a plurality of different page sizes. The page of data that is shifted may have a page size that is a selected one of the page sizes of the plurality of different page sizes, for example. In some examples, the shift of the data page comprises a page-sized shift. In some examples, performing 420 the memory defragmentation comprises shifting each data page of a plurality of data pages until all of the data pages of the plurality are adjacent to one another. In some examples, shifting of each of the data pages comprises performing a sequential compaction of the data pages.

Thus, there have been described examples of a shiftable memory supporting memory defragmentation, a memory defragmentation system comprising shiftable memory and a method of memory defragmentation that employ built-in shifting capability of the shiftable memory. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A shiftable memory supporting memory defragmentation, comprising:
   a memory device to store data, the memory device having a built-in shifting capability to shift only data of a plurality of contiguous subsets of stored data corresponding to respective pages of data from a first location to a second location within the memory device, each page of the pages of data having a size that is smaller than a total size of the memory device, wherein the built-in shifting capability is to:
      shift a first contiguous subset of the plurality of contiguous subsets to be adjacent a second contiguous subset of the plurality of contiguous subsets, and
      following the shifting of the first contiguous subset, shift a group of contiguous subsets including the first and second contiguous subsets together to the second location; and
   a memory defragmenter to shift the plurality of contiguous subsets using the built-in shifting capability of the memory device, the second location being adjacent to another page of stored data.

2. The shiftable memory of claim 1, wherein the shift of the first contiguous subset comprises a page-sized shift.

3. The shiftable memory of claim 1, wherein the memory device having built-in shifting capability provides a plurality of different page sizes, the pages of data having page sizes selected from the plurality of different page sizes.

4. A shiftable memory system comprising the shiftable memory of claim 1, the shiftable memory system further comprising a controller to select the pages of data and to implement the shift of the plurality of contiguous subsets according to the memory defragmenter.

5. The shiftable memory system of claim 4, wherein the controller comprises an augmented decoder to assert an output corresponding to each memory cell of a plurality of memory cells of a page of data within the memory.

6. The shiftable memory system of claim 4, wherein the controller comprises the memory defragmenter.

7. The shiftable memory of claim 1, wherein the built-in shifting capability is to shift the plurality of contiguous subsets of data without reading or writing of the data of the plurality of contiguous subsets of data by a resource external of the memory device.

8. The shiftable memory of claim 1, wherein the built-in shifting capability is to shift the plurality of contiguous subsets of data without reading or writing of the data of the plurality of contiguous subsets of data by a processor external of the memory device.

9. A memory defragmentation system comprising:
- a shiftable memory device comprising a plurality of memory cells, the shiftable memory device having built-in shifting capability to shift a plurality of contiguous subsets of data stored in the memory cells within the shiftable memory device, each contiguous subset of data of the plurality of contiguous subsets of data representing a page of data and having a size that is smaller than a total size of the shiftable memory device;
- a memory defragmenter to perform a shift of the pages of data represented by the plurality of contiguous subsets of data from a first location in the shiftable memory device to a second location adjacent to another page of data stored in the shiftable memory device using the built-in shifting capability, wherein the built-in shifting capability is to:
  - shift a first contiguous subset of the plurality of contiguous subsets to be adjacent a second contiguous subset of the plurality of contiguous subsets, and
  - following the shifting of the first contiguous subset, shift a group of contiguous subsets including the first and second contiguous subsets together to the second location; and
- a controller to select the pages of data and to implement the shift of the pages of data under direction of the memory defragmenter.

10. The memory defragmentation system of claim 9, wherein the controller comprises an augmented decoder to assert an output corresponding to each memory cell of a plurality of memory cells of each page of data within the shiftable memory device.

11. The memory defragmentation system of claim 9, wherein the shift of the pages of data performed by the memory defragmenter shifts each page of data of the pages of data until all of the pages of data are adjacent to one another.

12. The memory defragmentation system of claim 9, wherein the built-in shifting capability is to shift the plurality of contiguous subsets of data without reading or writing of the data of the plurality of contiguous subsets of data by a resource external of the shiftable memory device.

13. A method of memory defragmentation using a shiftable memory device, the method comprising:
- defining an array in memory cells of the shiftable memory device, the shiftable memory device having a plurality of memory cells and a built-in shifting capability to shift a plurality of contiguous subsets of data stored in the array from a first location to a second location, each contiguous subset of data of the plurality of contiguous subsets of data having a size that is less than a total size of the shiftable memory device, wherein the shifting of the plurality of contiguous subsets of data by the built-in shifting capability comprises:
  - shifting a first contiguous subset of the plurality of contiguous subsets to be adjacent a second contiguous subset of the plurality of contiguous subsets, and
  - following the shifting of the first contiguous subset, shifting a group of contiguous subsets including the first and second contiguous subsets together to the second location; and
- performing a memory defragmentation by using the built-in shifting capability to shift data pages representing the plurality of contiguous subsets of data stored in the array from the first location in the shiftable memory device to the second location adjacent to another page of data stored in the shiftable memory device,
- wherein the shifting of the plurality of contiguous subsets of data occurs entirely within the shiftable memory device and only data of the plurality of contiguous subsets of data is shifted.

14. The method of claim 13, wherein the shiftable memory device provides a plurality of different page sizes, the data pages having sizes selected from the plurality of different page sizes.

15. The method of claim 13, wherein the shift of each of the plurality of contiguous subsets of data comprises a page-sized shift, and wherein performing the memory defragmentation comprises shifting each data page of the data pages until all of the data pages are adjacent to one another.

16. The method of claim 15, wherein shifting each data page comprises performing a sequential compaction of the data pages.

17. The method of claim 13, wherein the shifting of the plurality of contiguous subsets of data by the built-in shifting capability is performed without reading or writing of the data of the plurality of contiguous subsets of data by a resource external of the shiftable memory device.

18. The method of claim 13, wherein the shifting of the plurality of contiguous subsets of data by the built-in shifting capability is performed without reading or writing of the data of the plurality of contiguous subsets of data by a processor external of the shiftable memory device.

* * * * *